(12) United States Patent
De Vries

(10) Patent No.: US 7,102,748 B2
(45) Date of Patent: Sep. 5, 2006

(54) LITHOGRAPHIC APPARATUS, DEVICE MANUFACTURING METHOD, AND COMPUTER PROGRAM

(75) Inventor: Alex De Vries, Meerlo (NL)

(73) Assignee: ASML Netherlands B.V., Veldhoven (NL)

( * ) Notice: Subject to any disclaimer, the term of this patent is extended or adjusted under 35 U.S.C. 154(b) by 174 days.

(21) Appl. No.: 10/926,397

(22) Filed: Aug. 26, 2004

(65) Prior Publication Data

US 2005/0078291 A1    Apr. 14, 2005

(30) Foreign Application Priority Data

Aug. 26, 2003  (EP)  ................................. 03255277

(51) Int. Cl.
- *G01B 11/00* (2006.01)
- *G03B 27/32* (2006.01)
- *A61N 5/00* (2006.01)
- *G21G 5/00* (2006.01)

(52) U.S. Cl. ...................... 356/399; 355/77; 250/492.2

(58) Field of Classification Search ................ 355/57; 356/399; 250/548

See application file for complete search history.

(56) References Cited

U.S. PATENT DOCUMENTS

| | | | |
|---|---|---|---|
| 4,362,385 A * | 12/1982 | Lobach ........................ 355/77 |
| 4,780,617 A * | 10/1988 | Umatate et al. ............ 250/548 |
| 5,691,541 A | 11/1997 | Ceglio et al. |
| 6,204,911 B1 | 3/2001 | Kurosawa et al. |
| 6,266,144 B1 | 7/2001 | Li |
| 6,330,052 B1 | 12/2001 | Yonekawa et al. |
| 6,368,985 B1 | 4/2002 | Wakamiya et al. |
| 6,587,201 B1 * | 7/2003 | Nishi ......................... 356/401 |
| 6,850,327 B1 * | 2/2005 | Taniguchi et al. .......... 356/399 |
| 2002/0085184 A1 | 7/2002 | Amano |
| 2004/0085059 A1 * | 5/2004 | Smith ....................... 324/158.1 |
| 2004/0169861 A1 * | 9/2004 | Mieher et al. .............. 356/400 |

FOREIGN PATENT DOCUMENTS

EP   1 170 636 A2   1/2002

* cited by examiner

*Primary Examiner*—W. B. Perkey
*Assistant Examiner*—Vivian Nelson
(74) *Attorney, Agent, or Firm*—Pillsbury Winthrop Shaw Pittman, LLP

(57) ABSTRACT

A lithographic production process according to one embodiment comprises an input section, pre-imaging processes, measurement of a substrate, exposure of the substrate, post-imaging processes, and output. A controller controls the time spent processing in the scanner based on an input of the rate at which substrates arrive from the pre-imaging processes. This control allows the scanner to optimize the accuracy of devices produced by selectively varying the duration of processes in the scanner.

20 Claims, 3 Drawing Sheets

LITHOGRAPHIC APPARATUS, DEVICE MANUFACTURING METHOD, AND COMPUTER PROGRAM

RELATED APPLICATIONS

This application claims priority to European Patent Application EP 03255277.0, filed Aug. 26, 2003, which document is herein incorporated by reference.

FIELD OF THE INVENTION

The present invention relates to lithographic apparatus and methods.

BACKGROUND

The term "patterning structure" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using one or more suitable electronic devices. In both of the situations described hereabove, the patterning structure can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging operation, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory operations may be carried out on one or more tables while one or more other tables are being used for exposures. Dual stage lithographic apparatus are described, for example, in U.S. Pat. No. 5,969,441 and WO 98/40791, incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

In a conventional lithographic apparatus, whether it is a wafer stepper or a step-and-scan apparatus, the imaging section processes each wafer in a fixed time. This time depends on the "recipe" for producing a device and also ensures that the exposure processing is completed before the next wafer arrives from the procedures prior to imaging. The imaging section spends some time waiting after it has finished exposing a wafer for the next wafer to arrive. This is an inefficient use of the projection system.

SUMMARY

In one embodiment of the invention, a lithographic apparatus configured to expose devices on a substrate includes a radiation system configured to provide a beam of radiation, and a support structure configured to support patterning structure, the patterning structure serving to pattern the beam of radiation according to a desired pattern. The apparatus includes a substrate table configured to hold said substrate, a projection system configured to project the patterned beam onto a target portion of the substrate, and a control system configured to control said lithographic apparatus to perform exposures, each exposure comprising a plurality of operations. The control system is configured to control the lithographic apparatus to operate at a desired throughput rate and, for at least one of said plurality of operations, to allot a corresponding period of time to execution of the operation. When the desired throughput rate is lower than a maximum throughput rate achievable by the apparatus, the control system is configured to increase the corresponding period of time allotted to at least one of said plurality of operations to increase the accuracy of the exposures.

A device manufacturing method according to another embodiment comprises using patterning structure to endow a beam of radiation with a pattern in its cross-section; projecting the patterned beam of radiation onto a target portion of a layer of radiation-sensitive material that at least partially covers a surface of a substrate; and controlling a lithographic apparatus to perform exposures, each exposure comprising a plurality of operations, and to operate at a desired throughput rate. For at least one of said plurality of operations, the controlling includes alloting a corresponding period of time to execution of the operation. Also, the controlling includes, when the desired throughput rate is lower than a maximum throughput rate achievable by the apparatus, increasing the corresponding period of time allotted to at least one of the plurality of operations to increase the accuracy of said exposures.

A lithographic apparatus according to a further embodiment includes a support structure configured to support patterning structure, the patterning structure serving to pattern a beam of radiation according to a desired pattern; a substrate table configured to hold the substrate; a projection system configured to project the patterned beam onto a target portion of the substrate; and a control system configured to control the apparatus to perform exposures, each exposure comprising a plurality of operations. The control system is configured to control the apparatus to operate at a desired throughput rate, and the control system is configured to increase a corresponding period of time allotted to each of at least one of the plurality of operations based on a difference between the desired throughput rate and a maximum throughput rate.

BRIEF DESCRIPTION OF THE DRAWINGS

Embodiments of the invention will now be described, byway of example only, with reference to the accompanying schematic drawings in which.

In the Figures, corresponding reference symbols indicate corresponding parts.

DETAILED DESCRIPTION

At least some of the embodiments of the present invention as described herein may be used to improve the utilization of a projection system in a lithographic apparatus.

Figure 1:
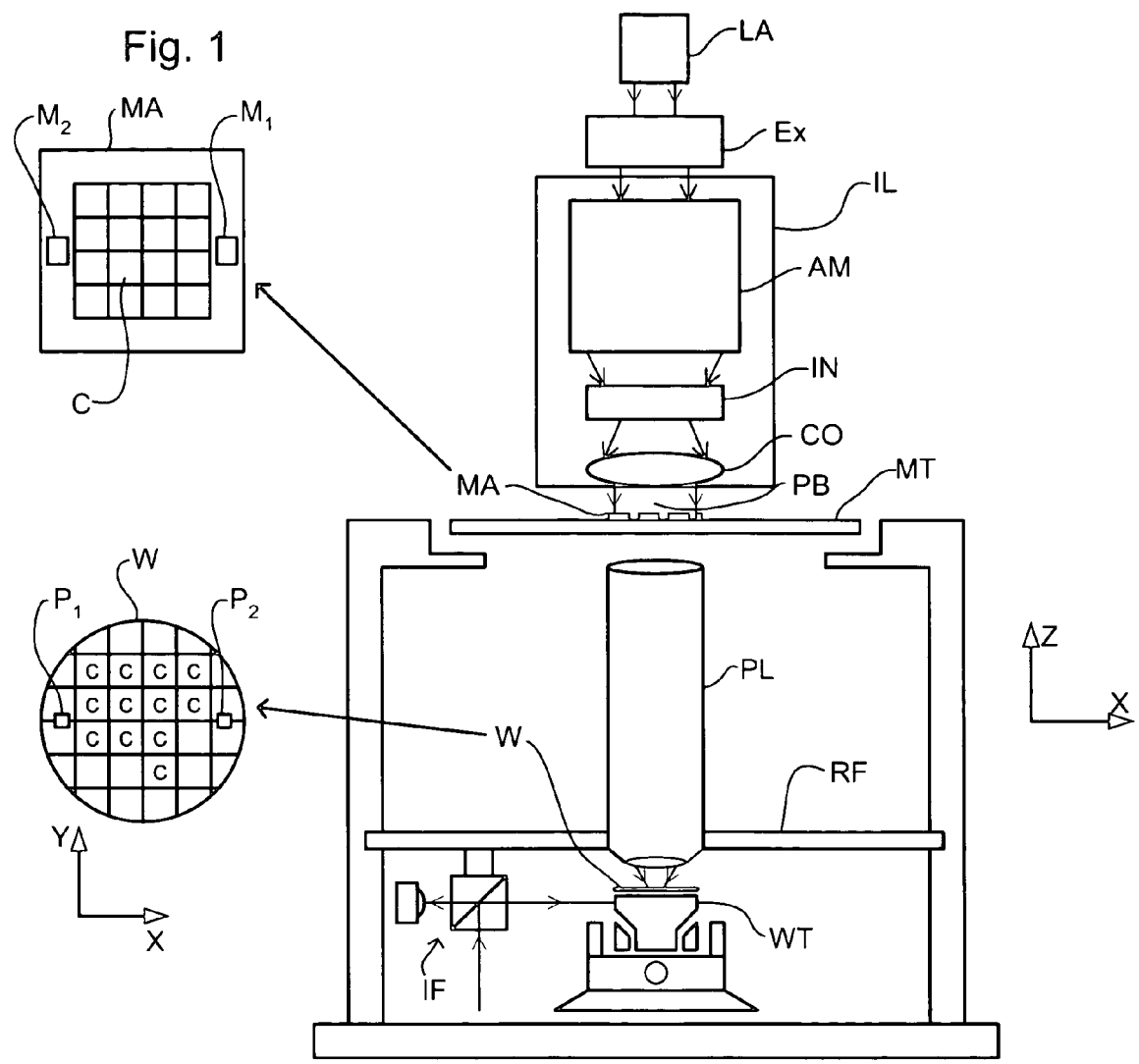
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, configured to supply a projection beam PB of radiation (e.g. UV radiation), which in this particular case also comprises a radiation source LA;

a first object table (mask table) MT provided with a mask holder configured to hold a mask MA (e.g. a reticle), and connected to a first positioning device configured to accurately position the mask with respect to item PL;

a second object table (substrate table) WT provided with a substrate holder configured to hold a substrate W (e.g. a resist-coated silicon wafer), and connected to a second positioning device configured to accurately position the substrate with respect to item PL;

a projection system ("lens") PL (e.g. a refractive lens system) configured to image an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source LA (e.g. an Hg lamp) produces a beam of radiation. This beam is fed into an illumination system (illuminator) IL, either directly or after having traversed one or more conditioning structures, such as a beam expander Ex, for example. The illuminator IL may comprise adjusting structure AM configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device (and interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 2:
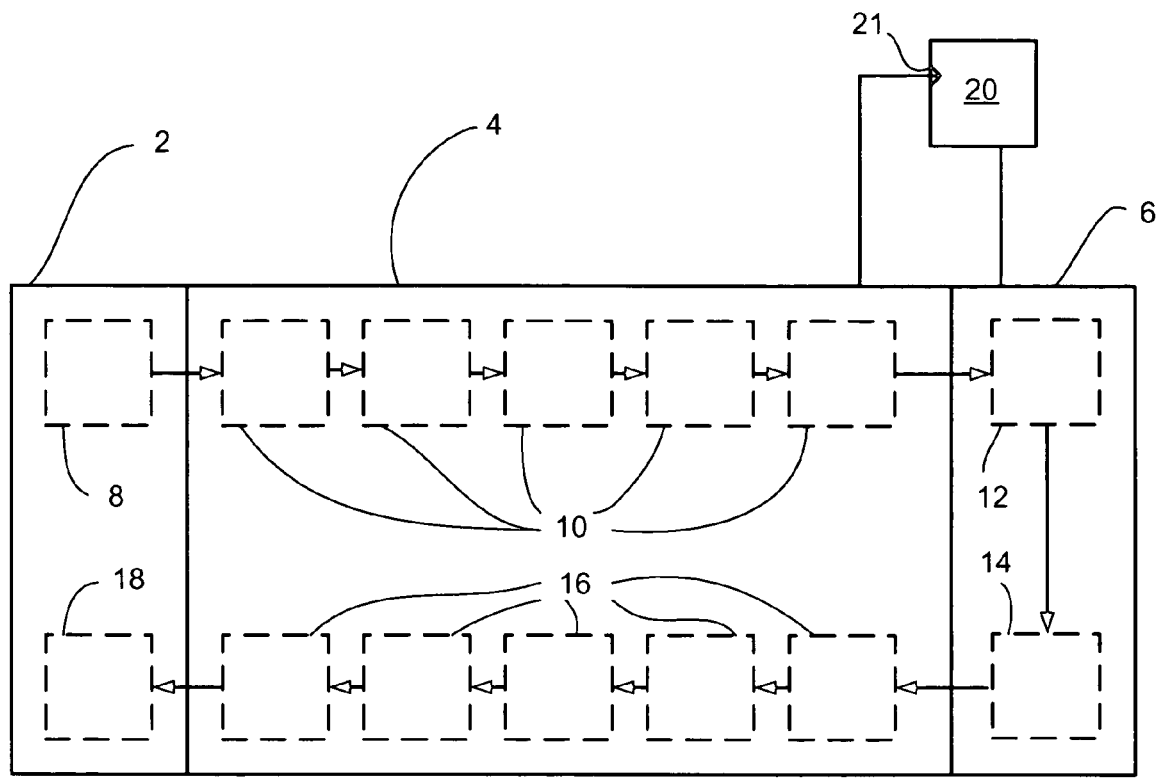
FIG. 2 depicts a lithographic projection process according to a first embodiment of the invention.

FIG. 2 schematically shows the processing of a substrate in a first embodiment of the present invention. The processing is divided into three sections. The input/output section 2 receives the blank substrates ready for processing and outputs the substrates after processing. The pre/post processing section (or "track") 4 carries out a variety of processing to the substrate to prepare it for imaging, and after imaging to produce the devices. Finally, the scanner apparatus 6 exposes the substrate with a pattern of the devices to be produced. The scanner apparatus 6 is controlled by a controller 20.

The processing of a substrate is as follows. A blank substrate is received by the input/output section 2 in position 8. The substrate then passes through a variety of pre-imaging operations 10. These vary depending on the device being produced, but typically include priming, resist coating and a soft bake. The substrate then progresses into the scanner section 6. Here it is measured in measurement section 12 to determine any variations in surface height or tilt which need to be compensated for when exposing the substrate. After measurement is completed the substrate passes to the exposure section 14, where the substrate is exposed with a pattern from a mask. After exposure, various post-exposure processes 16 occur depending on the nature of the device being produced. Typically, these post-exposure processes include post-exposure bake, development, a hard bake and measurement/inspection of the image features. Finally, the substrate passes to output section 18 where it is removed from the apparatus and can then subsequently be separated into individual devices.

The pre-exposure processes 10 take a certain time and result in a steady supply of substrates to the scanner 6 for imaging. The same pre-exposure processes are applied to each substrate in a given batch and therefore the supply rate to the scanner 6 may be kept constant. Data on the supply rate to the scanner 6 is supplied to the controller 20 by the track 4 at input 21. The maximum time which can be spent in the scanner 6 for each substrate is then calculated by the controller 20. This allows the controller 20 to allot times to one or more of the operations within the scanner 6 so that the scanner 6 is in use at all times, and there is no wasted time spent waiting after processing in the scanner 6 for a fresh substrate to arrive from the pre-imaging processes 10.

To achieve the correct time of processing in the scanner 6, the controller 20 assigns times to each of the constituent processes or operations carried out within the scanner. In one such sequence, for example, the substrate is aligned prior to measurement, then measured, then moved into the exposure section, aligned once more, exposed and then output from the scanner.

The controller can use a variety of methods to determine the time allotted to each operation. In a first method, the controller can selectively vary the duration of each of the operations, depending e.g. on the nature of the device being produced and knowledge of the effect of varying the duration of the operation(s) on the accuracy of the final device produced. For example, increasing the time spent aligning the substrate may result in more accurate measurements and imaging, because the substrate was positioned more accurately before these processes began. Alternatively, the speed of movement of the substrate table can be reduced, because it is easier to control a slower moving object more accurately. Likewise, the settling time allowed after an item is moved or an operating parameter is changed can be increased in the apparatus. Another option is to increase the time spent measuring the substrate, or to carry out more measurements. This allows the calculation of a trajectory for the substrate that better fits the plane of best focus to the actual substrate surface. The effect that each of these measures has on accuracy can be determined theoretically or experimentally.

Figure 3:
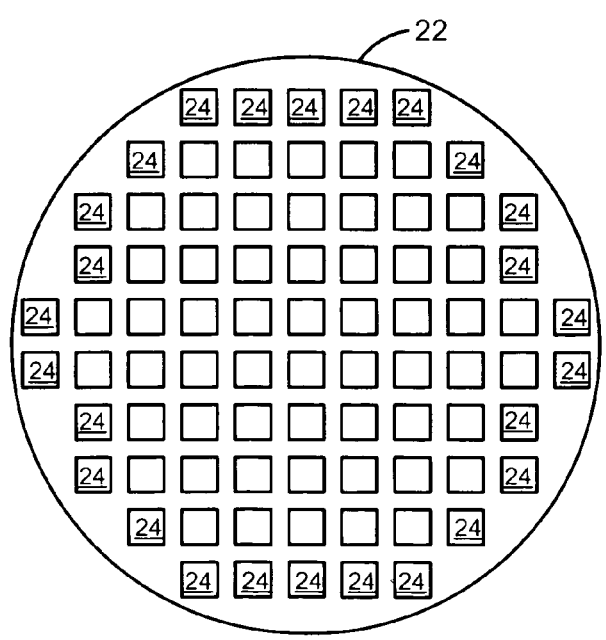
FIG. 3 depicts one arrangement of dies on a substrate.

In a second method, the controller 20 is more complex. On a given substrate, the devices produced towards a center of a substrate tend to be more accurate than the devices produced at the outer edges of the substrate. This is because the edges of the substrate are more prone to warping which can have an effect on the accuracy of the devices produced which are adjacent to the edge. One possible arrangement of dies on a substrate is illustrated in FIG. 3. The circular substrate 22 has evenly spaced dies arranged over its surface. The controller 20 can control the processes such that a greater time is spent measuring or imaging on the outer dies on the substrate. For example, the dies 24 are all adjacent to the edge of substrate 22 and therefore a greater time can be spent processing these dies than ones which are not adjacent to the edge. The controller 20 can decide which dies should have a greater processing time using a variety of methods. The simplest is simply to define that all dies adjacent to the edge of the substrate are processed with a longer time than others. However, more complex control can also be used. For example, the length of time to process a given die can vary according to its distance from the edge of the substrate. This variation can be based on experimental data of the relative benefit of increasing processing times for a die at a given position on a wafer.

Thus, an apparatus according to this embodiment may be used to allow the scanner 6 to be utilized for the entire time between the arrival of substrates. There is no need for a waiting time. Since the apparatus is in use for the entire time available, the accuracy of the devices produced by the apparatus is improved. However, the accuracy is also optimized by the controller 20, to ensure that the maximum accuracy is obtained within the time available.

Although the description of this embodiment has assumed that the limiting process in the critical path of the production process is the pre-exposure processes 10, any other process, such as the post-exposure processes 16 could be the limiting process. The apparatus can easily adapt to this by simply supplying the data on the time taken by the limiting process to the input 21 of the controller 20.

The control system of an apparatus according to this embodiment can be retrofitted to existing apparatus. This allows the accuracy of existing apparatus to be improved with only a minor modification to their construction.

Although a scanner 6 has been described where measurement of the substrate is carried out, the control system can also be applied to apparatus which does not measure the substrate. The control system can also be applied to a single or multi-stage scanner, not just the dual-stage apparatus described above.

Figure 4:
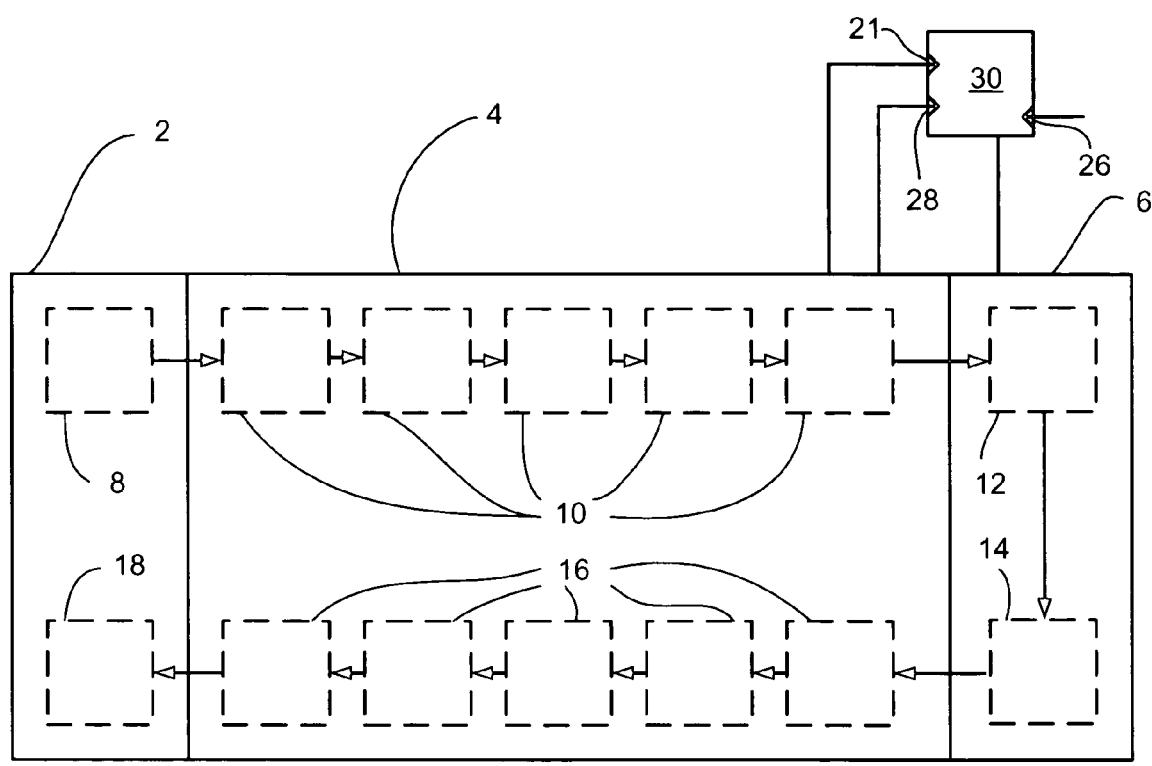
FIG. 4 depicts a lithographic projection process according to a second embodiment of the invention.

FIG. 4 depicts a production process according to a further embodiment of the present invention. The construction of this embodiment may be as for the first embodiment, save as described below.

In this embodiment, the controller 30 optimizes the accuracy of the devices produced in the scanner section 6. A required accuracy is input to the controller 30 by an input 26. This accuracy may be expressed as, for example, a maximum overlay error vector or a maximum overlay error in the x or y direction. The controller 30 then uses this information, together with stored data on the accuracy of devices produced for given processing times to set the overall processing time within the scanner 6. This is then output via output 28 to the track 4. The track 4 then carries out the pre-imaging processes 10 such that substrates are supplied at the rate required for the processing time in the scanner 6.

The overall time is calculated by the controller 30 as e.g. the fastest way to produce the substrates of the required accuracy. Data on the accuracy of the devices produced against the process time is stored by the controller 30. The methods of the first embodiment can be used by varying time to reach a target accuracy. Knowledge of the relative effect on accuracy of the duration of each process is also used to minimize the production time for the required accuracy.

If the processing time initially calculated by the controller 30 is less than the fastest rate at which substrates can be provided by the track 4 from the pre-imaging processes 10, this information is fed back to the controller 30 by input 21. The controller 30 may then switch operation to a mode as described in the first embodiment, where the accuracy is determined according to the rate at which substrates are supplied. This ensures that the highest quality of devices are produced and there is no unnecessary waiting time within the scanner section 6.

The table below shows an example of the effect of using normally unused waiting time within the stepper or scanner to improve the accuracy of the devices produced. The experiment was carried out under three conditions: normal known processing in which there is no delay prior to exposure and only 45 ms delay after exposure, improved processing with an extra 400 ms used before exposure and the standard 45 ms used after exposure, and improved processing with an extra 400 ms both before and after exposure. The extra time was used to increase the settling time before or after the substrate table was moved in a stepper apparatus.

| Experiment conditions | Substrate No. | Maximum overlay error X | Maximum overlay error Y | Maximum overlay error vector |
|---|---|---|---|---|
| 400 ms before and 400 ms after | 1 | 47 | 38 | 53 |
| | 2 | 52 | 40 | 58 |
| | 3 | 55 | 48 | 63 |
| | 4 | 71 | 39 | 76 |
| | 5 | 36 | 40 | 46 |
| | 6 | 46 | 39 | 49 |
| | 7 | 45 | 35 | 52 |
| | Average | 50.29 | 39.86 | 56.71 |
| 400 ms before and 45 ms after | 8 | 53 | 42 | 54 |
| | 9 | 44 | 37 | 53 |
| | 10 | 57 | 36 | 58 |
| | 11 | 54 | 35 | 55 |
| | 12 | 68 | 47 | 69 |
| | 13 | 41 | 42 | 49 |
| | 14 | 53 | 37 | 55 |
| | Average | 52.86 | 39.43 | 56.14 |

-continued

| Experiment conditions | Substrate No. | Maximum overlay error X | Maximum overlay error Y | Maximum overlay error vector |
|---|---|---|---|---|
| 0 ms before and 45 ms after (Prior art conditions) | 15 | 67 | 35 | 67 |
| | 16 | 56 | 30 | 60 |
| | 17 | 53 | 33 | 54 |
| | 18 | 78 | 39 | 81 |
| | 19 | 61 | 34 | 62 |
| | 20 | 52 | 34 | 53 |
| | 21 | 70 | 45 | 74 |
| | Average | 62.43 | 35.71 | 64.43 |

It can be seen that increasing the settling time before and after exposure does devices produced. However, for this situation, there is greater benefit in using more time before exposure than after exposure, as shown by the very small difference between the two sets of result with a 400 ms delay prior to exposure. The two sets of results were very similar and indicate that a further delay of 400 ms after exposure is of less benefit than a delay of 400 ms prior to exposure.

This experiment illustrates how the accuracy of the process can be improved by using otherwise wasted waiting times within the stepper or scanner. However, the data can also be applied to producing devices with a given accuracy by correlating the accuracy obtained with the times.

Embodiments of the invention include a lithographic projection apparatus for exposing devices on a substrate, the apparatus comprising a radiation system for providing a projection beam of radiation; a support structure for supporting patterning structure, the patterning structure serving to pattern the projection beam according to a desired pattern; a substrate table for holding said substrate; a projection system for projecting the patterned beam onto a target portion of the substrate; a control system for controlling said lithographic projection apparatus to perform exposures, each exposure comprising a plurality of substeps, and an input configured to receive a desired throughput rate. In this embodiment, the control system is adapted to control the apparatus to operate at said desired throughput rate and, when said desired throughput rate is lower than a maximum throughput rate achievable by said apparatus, to increase the time allotted to one or more of said operations to increase the accuracy of said exposures.

The addition of a control system which actively controls the time allotted to operations allows the accuracy to be optimized. It also ensures that all the time available for exposing a substrate is used: no time is wasted waiting for the next substrate to arrive.

Optionally, the apparatus further comprises a measurement system for measuring the surface characteristics of at least a part of a surface of the substrate which includes the target portion, wherein said operations include measuring a surface height and tilt of the substrate using said measurement system, and wherein the control system can increase the number of measurements taken by the measurement system. Such use of a measurement system allows any variations in the surface height and tilt of the substrate to be measured prior to imaging. This can then be used to compensate for any variations in the projected image due to variations in the surface of the substrate. Increasing the time spent on this measurement may increase the accuracy because the surface characteristics are known more accurately, and hence the projected image can be compensated more accurately. Allowing more time for measurements or increasing the number of measurements taken also allows the calculation of a trajectory for the substrate during a series of exposures that better fits the plane of best focus to the actual substrate surface.

Advantageously, the substrate contains multiple devices, and the controller (or "control system") increases the number of measurements taken of those devices which are located adjacent to the edge of the exposed surface of the substrate.

The edge of the substrate may be less uniform than the center, and it may also be more prone to warping. Therefore, a greater benefit can be gained by spending longer measuring the devices which are located adjacent to the edge of the substrate because these are likely to have greater surface variations than devices located near the center of the substrate.

Preferably, the substeps include aligning said substrate, and said control system can increase the number of alignments carried out in said step of aligning. Increasing the time spent aligning the substrate may allow the subsequent steps to be more accurate because e.g. the substrate is positioned more accurately.

Preferably, the substeps include allowing the substrate and/or apparatus to settle after a change in its operating state, and said control system can increase the time allotted to said settling. If the settling time is increased, the accuracy may be improved because e.g. there is a greater time for the new operating conditions to be reached accurately.

Preferably, the substeps include moving said substrate table, and said control system can increase the time allotted to said movements by decreasing the speed of movements of said substrate table. If the substrate table is moved more slowly, its movement can be controlled more accurately and hence the overall accuracy may be increased.

Advantageously, the input is configured to receive a desired accuracy of the devices produced, the apparatus further comprising an output for outputting data of the rate at which substrates should arrive at the apparatus, wherein the rate at which substrates should arrive is determined by the control system by allotting time to the substeps based on the desired accuracy. The apparatus receives a desired accuracy of the devices produced and calculates the minimum production time for it to be achieved. This is then output for use in the earlier production processes, and to ensure that substrates do not arrive too fast or too slow at the lithographic apparatus. It is therefore possible to operate the apparatus based on desired accuracy and not just maximizing throughput.

According to another embodiment, an apparatus as described above is connected to a track by respective interfaces, and data on the throughput rate or the rate at which substrates should arrive is transferred between said apparatus and said track over said interfaces. This allows the projection apparatus to exchange data with the track. The data can be used by the projection apparatus to optimize the accuracy of the devices produced within the time available, or by the track to ensure that it supplies substrates at the correct rate.

According to a further embodiment, a device manufacturing method comprises providing a substrate that is at least partially covered by a layer of radiation-sensitive material; providing a projection beam of radiation using a radiation system; using patterning means to endow the projection beam with a pattern in its cross-section; projecting the patterned beam of radiation onto a target portion of the layer of radiation-sensitive material; and controlling said lithographic projection apparatus to perform exposures, each exposure comprising a plurality of substeps; and receiving an input of a desired throughput rate; wherein said step of controlling controls the apparatus to operate at said desired throughput rate and, when said desired throughput rate is lower than a maximum throughput rate achievable by said apparatus, the time allotted to one or more of said substeps is increased to increase the accuracy of said exposures. Such a method allows the accuracy of the devices produced to be optimized. All the time available for exposing the substrate is used: there is no waiting time. Furthermore the accuracy of the devices is improved by actively allotting time to various substeps depending on their effect on accuracy.

Optionally, the substeps include measuring a surface height and tilt of at least a part of a surface of said substrate which includes said target portion; and the time allotted to said measuring is increased by increasing the number of measurements carried out.

If the surface variations in height and tilt are measured prior to projecting an image on the substrate the quality of the projected image can be increased by compensating for variations in the surface of the substrate.

Preferably, the substrate contains multiple devices and the number of measurements taken of those devices which are adjacent to the edge of the exposed surface of the substrate is increased. The edges of the substrate are more likely to have variations in surface height and tilt than the center. Therefore a greater improvement in accuracy can be achieved by spending longer measuring substrates adjacent to the edge of the substrate those nearer the center.

Preferably, the substeps include aligning said substrate, and the time allotted to said aligning is increased by increasing the number of alignments carried out. Spending more time aligning means the position of the substrate is known more accurately and hence more accurate devices will be produced.

Preferably, the substeps include allowing the substrate and/or apparatus to settle after a change in its operating state, and the time allotted to said settling is increased. Increasing the settling time allows a change in operating conditions to be achieved more accurately.

Preferably, the substeps include moving said substrate table, and the time allotted to said movements is increased by decreasing the speed of movements of said substrate table. Moving the substrate more slowly allows it to be positioned more accurately and hence the accuracy is improved.

Preferably, the step of receiving receives a desired accuracy of the devices produced, the method further comprising outputting data of the rate at which substrates should arrive at the apparatus; wherein said rate at which substrates should arrive is determined by allotting time to the substeps based on said desired accuracy.

If a desired accuracy of devices is known, this can be used to set the processing time within the projecting and/or measuring stages and therefore give information on the rate at which substrates need to arrive for processing. This allows the production process to be driven by quality of devices produced, and not simply the duration of the processes carried out on the substrate prior to projection.

While specific embodiments of the invention have been described above, it will be appreciated that the invention may be practiced otherwise than as described. For example, embodiments of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the embodiments as described without departing from the scope of the claims set out below.

The invention claimed is:

1. A lithographic apparatus configured to expose devices on a substrate, the apparatus comprising:
   a radiation system configured to provide a beam of radiation;
   a support structure configured to support patterning structure, the patterning structure serving to pattern the beam of radiation according to a desired pattern;
   a substrate table configured to hold said substrate;
   a projection system configured to project the patterned beam onto a target portion of the substrate; and
   a control system configured to control said lithographic apparatus to perform exposures, each exposure comprising a plurality of operations,
   wherein said control system is configured to control said lithographic apparatus to operate at a desired throughput rate, and
   wherein, for at least one of said plurality of operations, said control system is configured to allot a corresponding period of time to execution of the operation, and
   wherein, when said desired throughput rate is lower than a maximum throughput rate achievable by said lithographic apparatus, said control system is configured to increase the corresponding period of time allotted to at least one of said plurality of operations to increase the accuracy of said exposures.

2. The lithographic apparatus according to claim 1, said apparatus comprising a measurement system configured to measure at least one characteristic of at least a part of a surface of said substrate which includes said target portion,
   wherein said plurality of operations includes measuring a surface height and tilt of said substrate using said measurement system, and
   wherein said control system is configured to increase the number of measurements taken by said measurement system during said measuring.

3. The lithographic apparatus according to claim 2, wherein said substrate contains devices located adjacent to an edge of the exposed surface of the substrate, and
   wherein said control system is configured to increase the number of measurements taken of at least one of said devices located adjacent to the edge as compared to a number of measurements taken of a device located away from said edge.

4. The lithographic apparatus according to claim 1, wherein said plurality of operations includes aligning said substrate, and
   wherein said control system is configured to increase the number of alignments carried out in said aligning.

5. The lithographic apparatus according to claim 1, wherein said plurality of operations includes allowing at least one of the group consisting of the substrate and the apparatus to settle after a change in its operating state, and
   wherein said control system is configured to increase a period of time allotted to said allowing to settle.

6. The lithographic apparatus according to claim 1, wherein said plurality of operations includes moving said substrate table, and
   wherein said control system is configured to increase a period of time allotted to said moving said substrate table by decreasing a speed of movement of said substrate table.

7. The lithographic apparatus according to claim 1, wherein said control system is configured to receive a desired accuracy of the devices produced, and wherein the apparatus is configured to output an indication of a desired rate of input of substrates to the apparatus, said rate being determined by said control system by allotting a corresponding period of time to each of at least one of said plurality of operations based on said desired accuracy.

8. The lithographic apparatus according to claim 1, said apparatus being connected to a track by at least one interface, and wherein an indication of at least one of the group consisting of the desired throughput rate and the desired rate of input is transferred between said apparatus and said track over said at least one interface.

9. A device manufacturing method comprising:

using patterning structure to endow a beam of radiation with a pattern in its cross-section;

projecting the patterned beam of radiation onto a target portion of a layer of radiation-sensitive material that at least partially covers a surface of a substrate; and controlling a lithographic apparatus to perform exposures, each exposure comprising a plurality of operations, and to operate at a desired throughput rate, wherein, for at least one of said plurality of operations, said controlling includes alloting a corresponding period of time to execution of the operation, and wherein said controlling includes, when said desired throughput rate is lower than a maximum throughput rate achievable by said lithographic apparatus, increasing the corresponding period of time allotted to at least one of said plurality of operations to increase the accuracy of said exposures.

10. The device manufacturing method according to claim 9, wherein said plurality of operations includes measuring a surface height and tilt of at least a part of a surface of said substrate which includes said target portion, and wherein said increasing includes increasing a period of time allotted to said measuring by increasing the number of measurements carried out.

11. The device manufacturing method according to claim 10, wherein said substrate contains devices located adjacent to an edge of the exposed surface of the substrate, and wherein said increasing includes increasing a number of measurements taken of at least one of the devices located adjacent to the edge as compared to a number of measurements taken of a device located away from said edge.

12. The device manufacturing method according to claim 9, wherein said plurality of operations includes aligning said substrate, and wherein said increasing includes increasing the number of alignments carried out.

13. The device manufacturing method according to claim 9, wherein said plurality of operations includes allowing at least one of the group consisting of the substrate and the lithographic apparatus to settle after a change in its operating state, and wherein said increasing includes increasing a period of time allotted to said allowing to settle.

14. The device manufacturing method according to claim 9, wherein said plurality of operations includes moving said substrate table, and wherein said increasing includes increasing a period of time allotted to said moving the substrate table by decreasing a speed of movement of said substrate table.

15. The device manufacturing method according to claim 9, wherein said controlling includes receiving a desired accuracy of the devices produced, and wherein said method comprises outputting an indication of a desired rate of input of substrates to the lithographic apparatus, said rate being determined by allotting a corresponding period of time to each of at least one of said plurality of operations based on said desired accuracy.

16. A data storage medium including machine-executable instructions describing a device manufacturing method comprising:

using patterning structure to endow a beam of radiation with a pattern in its cross-section;

projecting the patterned beam of radiation onto a target portion of a layer of radiation-sensitive material that at least partially covers a surface of a substrate; and controlling a lithographic apparatus to perform exposures, each exposure comprising a plurality of operations, and to operate at a desired throughput rate, wherein, for at least one of said plurality of operations, said controlling includes alloting a corresponding period of time to execution of the operation, and wherein said controlling includes, when said desired throughput rate is lower than a maximum throughput rate achievable by said lithographic apparatus, increasing the corresponding period of time allotted to at least one of said plurality of operations to increase the accuracy of said exposures.

17. A lithographic apparatus comprising:

a support structure configured to support patterning structure, the patterning structure serving to pattern a beam of radiation according to a desired pattern;

a substrate table configured to hold said substrate;

a projection system configured to project the patterned beam onto a target portion of the substrate; and a control system configured to control said lithographic apparatus to perform exposures, each exposure comprising a plurality of operations, wherein said control system is configured to control said lithographic apparatus to operate at a desired throughput rate, and wherein said control system is configured to increase a corresponding period of time allotted to each of at least one of said plurality of operations based on a difference between said desired throughput rate and a maximum throughput rate.

18. The lithographic apparatus according to claim 17, wherein said plurality of operations includes aligning the substrate with respect to a reference position, and wherein said control system is configured to vary a number of alignments of said target portion based on said difference.

19. The lithographic apparatus according to claim 17, wherein said plurality of operations includes measuring at least one of the group consisting of a height of said target portion with respect to a reference position and a tilt of said target portion with respect to a reference orientation, and wherein said control system is configured to vary, based on said difference, a number of measurements of at least one of the group consisting of a height and a tilt of said target.

20. The lithographic apparatus according to claim 17, wherein, based on said difference, said control system is configured to increase at least one of the group consisting of (A) a number of measurements of a position of a feature of the substrate with respect to a reference position, (B) a number of measurements of a height of a portion of a surface of said substrate with respect to a reference position, and (C) a number of measurements of a tilt of said portion with respect to a reference orientation.

* * * * *